United States Patent
Qi et al.

(10) Patent No.: US 10,050,125 B1
(45) Date of Patent: Aug. 14, 2018

(54) VERTICAL-TRANSPORT FIELD-EFFECT TRANSISTORS WITH AN ETCHED-THROUGH SOURCE/DRAIN CAVITY

(71) Applicant: GLOBALFOUNDRIES Inc., Grand Cayman (KY)

(72) Inventors: Yi Qi, Niskayuna, NY (US); Hui Zang, Guilderland, NY (US); Xusheng Wu, Ballston Lake, NY (US); Hsien-Ching Lo, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/676,300

(22) Filed: Aug. 14, 2017

(51) Int. Cl.
| | | |
|---|---|---|
| *H01L 29/76* | (2006.01) | |
| *H01L 29/66* | (2006.01) | |
| *H01L 21/02* | (2006.01) | |
| *H01L 21/768* | (2006.01) | |
| *H01L 23/535* | (2006.01) | |
| *H01L 29/78* | (2006.01) | |
| *H01L 29/08* | (2006.01) | |

(52) U.S. Cl.
CPC .. *H01L 29/66666* (2013.01); *H01L 21/02532* (2013.01); *H01L 21/02573* (2013.01); *H01L 21/02636* (2013.01); *H01L 21/76805* (2013.01); *H01L 21/76895* (2013.01); *H01L 23/535* (2013.01); *H01L 29/0847* (2013.01); *H01L 29/7827* (2013.01); *H01L 21/02381* (2013.01)

(58) Field of Classification Search
CPC ......... H01L 29/66666; H01L 21/02532; H01L 21/02573; H01L 21/02636; H01L 21/76805; H01L 21/76895; H01L 23/535; H01L 29/0847; H01L 29/7827; H01L 21/02381; H01L 27/11273; H01L 27/2454
USPC ......... 257/288, 368, 369; 438/151, 197, 199
See application file for complete search history.

(56) References Cited

U.S. PATENT DOCUMENTS

| | | | |
|---|---|---|---|
| 5,817,562 A | 10/1998 | Chang et al. | |
| 6,977,601 B1 | 12/2005 | Fletcher et al. | |
| 7,211,864 B2 | 5/2007 | Seliskar | |
| 7,714,384 B2 | 5/2010 | Seliskar | |
| 8,273,617 B2 | 9/2012 | Thompson et al. | |
| 9,349,868 B1 * | 5/2016 | Balakrishnan | H01L 29/7856 |
| 9,385,218 B1 * | 7/2016 | Cheng | H01L 29/66795 |
| 9,466,702 B1 * | 10/2016 | Balakrishnan | H01L 29/66795 |
| 9,748,380 B1 * | 8/2017 | Lie | H01L 29/7827 |

\* cited by examiner

*Primary Examiner* — Shahed Ahmed
(74) *Attorney, Agent, or Firm* — Thompson Hine LLP; Yuanmin Cai (57) ABSTRACT

Methods of forming a structure for a vertical-transport field-effect transistor and structures for a vertical-transport field-effect transistor. A semiconductor fin is formed on a sacrificial layer, and trench isolation is formed in which the semiconductor fin is embedded. The trench isolation is removed at opposite sidewalls of the semiconductor fin. After the trench isolation is removed at opposite sidewalls of the semiconductor fin, the sacrificial layer is removed to form a cavity extending beneath the semiconductor fin while the semiconductor fin is supported by the trench isolation adjacent to opposite end surfaces of the semiconductor fin. A semiconductor material is formed in the cavity to provide a source/drain region.

17 Claims, 7 Drawing Sheets

VERTICAL-TRANSPORT FIELD-EFFECT TRANSISTORS WITH AN ETCHED-THROUGH SOURCE/DRAIN CAVITY

BACKGROUND

The present invention relates to semiconductor device fabrication and integrated circuits and, more specifically, to methods of forming a structure for a vertical-transport field-effect transistor and structures for a vertical-transport field-effect transistor.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation.

Planar field-effect transistors and fin-type field-effect transistors constitute a category of transistor structures in which the flow of gated current in the channel is oriented in a horizontal direction parallel to the substrate surface. In a vertical-transport field-effect transistor, the source/drain regions are arranged at the top and bottom of a semiconductor fin or pillar. The direction of the gated current in the channel between the source region and the drain region is oriented generally perpendicular (i.e., vertical) to the substrate surface and parallel to the height of the semiconductor fin or pillar.

In conventional constructions for a vertical-transport field-effect transistor, the epitaxial semiconductor material constituting the bottom source/drain region may be formed in areas between semiconductor fins. However, the epitaxial semiconductor material of the bottom source/drain region does not form beneath the semiconductor fins.

SUMMARY

In an embodiment, a method of forming a structure for a vertical-transport field effect transistor is provided. The method includes forming a semiconductor fin on a sacrificial layer, forming trench isolation in which the semiconductor fin is embedded, and removing the trench isolation at opposite sidewalls of the semiconductor fin. After the trench isolation is removed at opposite sidewalls of the semiconductor fin, the sacrificial layer is removed to form a cavity extending beneath the semiconductor fin while the semiconductor fin is supported by the trench isolation adjacent to opposite end surfaces of the semiconductor fin. A semiconductor material is formed in the cavity to provide a source/drain region.

In an embodiment, a structure for a vertical-transport field effect transistor is provided. The structure includes a semiconductor fin, a first source/drain region arranged to extend completely beneath the semiconductor fin, a second source/drain region, and a gate stack arranged vertically between the first source/drain region and the second source/drain region. The first source/drain region is composed of a volume of a semiconductor material having a uniformly-distributed dopant concentration.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1B is a top view of the device structure in which FIG. 1 is taken generally along line 1-1 and FIG. 1A is taken generally along line 1A-1A.

DETAILED DESCRIPTION

Figure 1:
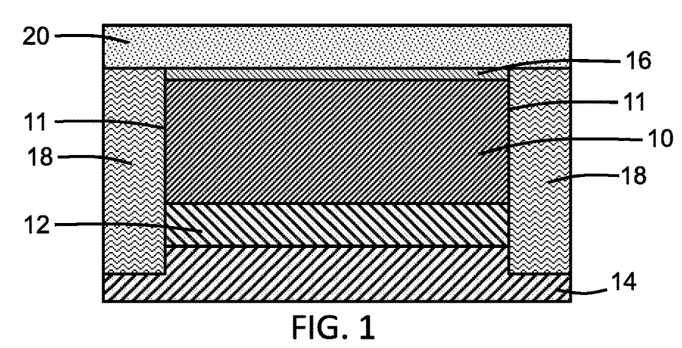
FIGS. 1-4 are cross-sectional views of a device structure at successive fabrication stages of a processing method in accordance with embodiments of the invention.
Figure 1A:
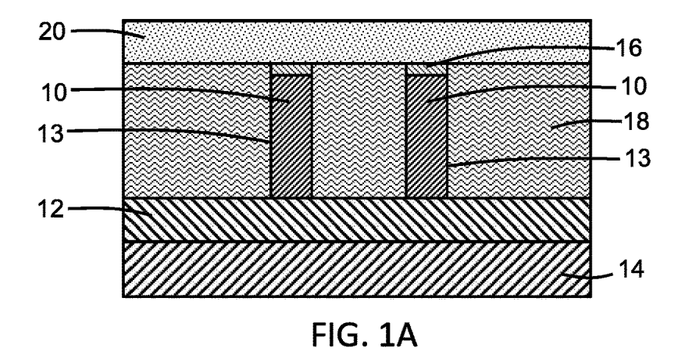
FIG. 1A is a cross-sectional view of the device structure of FIG. 1.
Figure 1B:
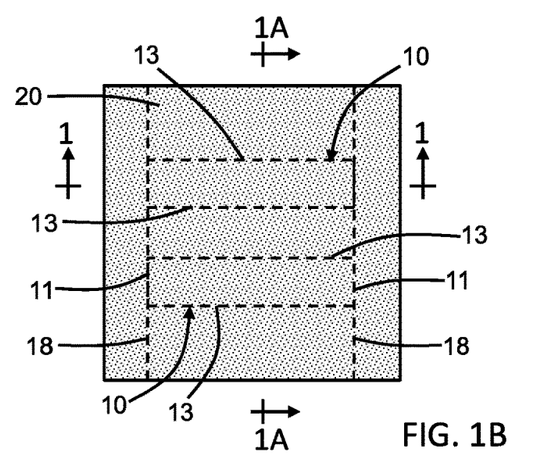

With reference to FIGS. 1, 1A, 1B and in accordance with embodiments of the invention, fins 10 project in a vertical direction from a sacrificial layer 12 that is formed on a substrate 14, such as a bulk single-crystal silicon substrate. The fins 10 are three-dimensional bodies composed of a semiconductor material, such as undoped or intrinsic silicon. The fins 10 include sidewalls 13 that project in a vertical direction relative to the top surface of the sacrificial layer 12. The fins 10 may be formed from an epitaxial layer of, for example, intrinsic semiconductor material that is patterned using photolithography and etching processes, such as a sidewall imaging transfer (SIT) process or self-aligned double patterning (SADP). The fins 10 may be capped by a dielectric cap 16 that is composed of a dielectric material, such as silicon carbonitride (SiCN), and that may be a remnant of the patterning process. Alternatively, the dielectric cap 16 may be absent and/or removed from the fins 10.

The sacrificial layer 12 may be epitaxially grown using the substrate 14 as a growth seed, and the layer used to form the fins 10 may be epitaxially grown using the sacrificial layer 12 as a growth seed. The sacrificial layer 12 may be composed of a material, such as silicon-germanium, that can be etched selective to the semiconductor material (e.g., silicon) of the fins 10 and to the semiconductor material of the substrate 14 (e.g., silicon). As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Due to the difference in composition, the sacrificial layer 12 may operate as an etch stop during the patterning of the fins 10. In an embodiment, the sacrificial layer 12 may be composed of SiGe with a germanium content ranging from twenty-five percent (25%) to thirty-five percent (35%), which etches at a higher rate than silicon.

The fins 10 are embedded in trench isolation 18 that may be composed of a dielectric material, such as an oxide of silicon (e.g., silicon dioxide ($SiO_2$)). The trench isolation 18 may be planarized to the top surface of the dielectric caps 16. The fins 10 include opposite end surfaces 11 located adjacent to the trench isolation 18 in a lengthwise direction. The opposite end surfaces 11 connect the opposite sidewalls 13 of the fins 10 and the connected set of end surfaces 11 and sidewalls 13 extend completely about the outer perimeter of each fin 10.

A sacrificial layer 20 is applied and patterned to form an etch mask that covers the fins 10 and overlaps with the trench isolation 18. The sacrificial layer 20 may be comprised of a silicon nitride ($Si_3N_4$), and may be patterned by lithography and etching to form the etch mask.

Figure 2:
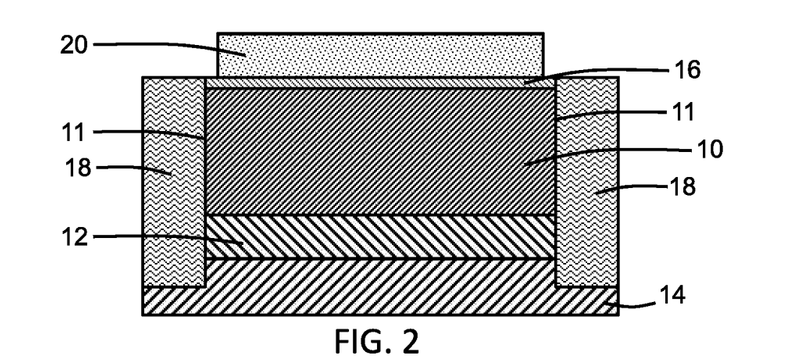

With reference to FIG. 2 in which like reference numerals refer to like features in FIG. 1 and at a subsequent fabrication stage, the sacrificial layer 20 is opened above the trench isolation 18 adjacent to the opposite end surfaces 11 of the fins 10, which exposes the trench isolation 18 adjacent to the end surfaces 11 of the fins 10. The trench isolation between the sidewalls 13 of the fins 10 remains covered by the sacrificial layer 20. The sacrificial layer 20 may be patterned to expose the trench isolation 18 adjacent to the end surfaces 11 of the fins 10 using photolithography and etching processes.

Figure 3:
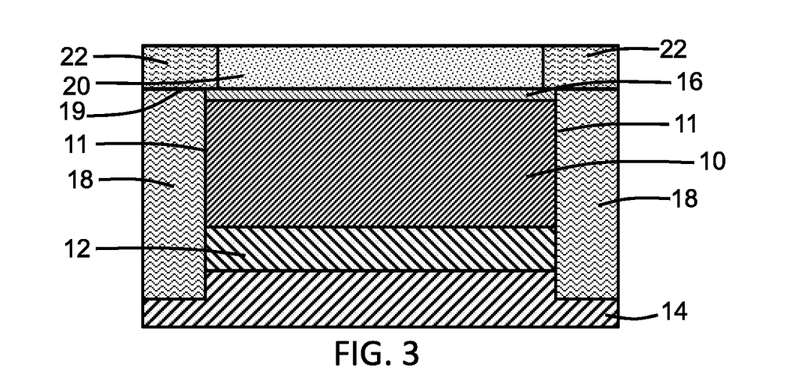

With reference to FIG. 3 in which like reference numerals refer to like features in FIG. 2 and at a subsequent fabrication stage, sections of a dielectric layer 22 are deposited on a top surface 19 of the exposed trench isolation 18 at the opposite end surfaces 11 of the fins 10. The dielectric layer 22 may be composed of a dielectric material, such as silicon dioxide ($SiO_2$) that is deposited by high-density plasma (HDP) deposition and that exhibits etch selectivity relative to the material of the sacrificial layer 20. The addition of the dielectric layer 22 increases the effective thickness of the trench isolation 18 adjacent to the opposite end surfaces 11 of the fins 10 in comparison to the thickness of the trench isolation 18 between the fins 10 and adjacent to the opposite sidewalls 13 of the fins 10.

Figure 4:
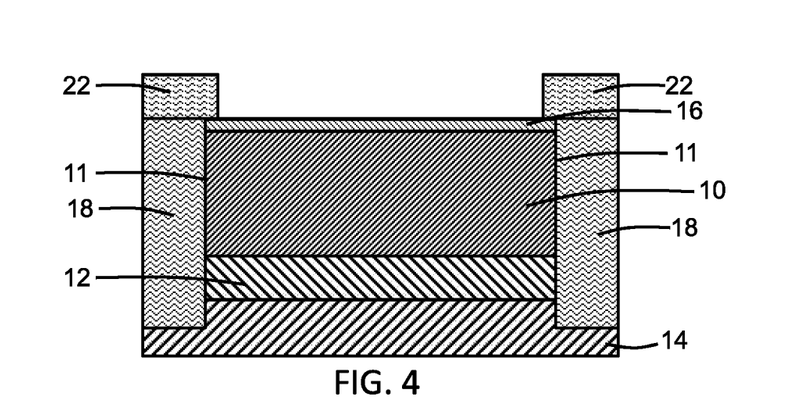

With reference to FIG. 4 in which like reference numerals refer to like features in FIG. 3 and at a subsequent fabrication stage, the sacrificial layer 20 is removed, which exposes the fins 10 and the trench isolation 18 between the fins 10. The sections of the dielectric layer 22 project from the top surface 19 of the trench isolation 18 above the top surface of the dielectric caps 16 and the top surface of the fins 10.

Figure 5:
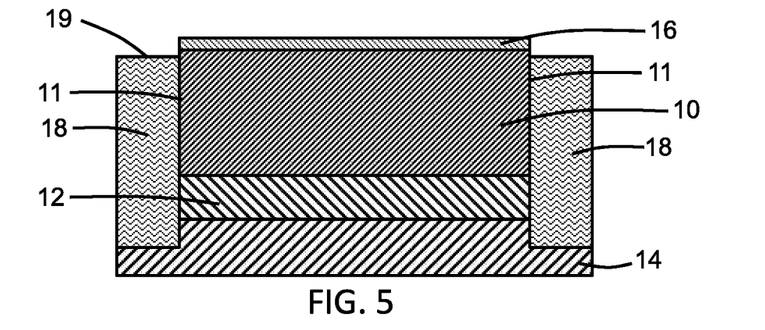
FIG. 5 is a cross-sectional view at a fabrication stage subsequent to FIG. 4.
Figure 5A:
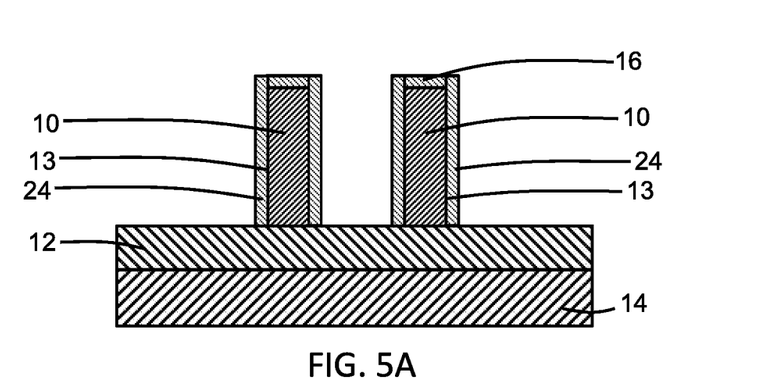
FIG. 5A is a cross-sectional view similar to FIG. 1A at the fabrication stage of FIG. 5.

With reference to FIGS. 5, 5A in which like reference numerals refer to like features in FIG. 4 and at a subsequent fabrication stage, an etching process is used to remove the trench isolation 18 adjacent to the sidewalls 13 of the fins 10 and between the fins 10. For example, the etching process may be a remote plasma-assisted dry etch process that involves the simultaneous exposure of the trench isolation 18 and dielectric layer 22 to $H_2$, $NF_3$ and $NH_3$ plasma by-products, and that removes the silicon dioxide of the trench isolation 18 and the dielectric layer 22 but does not readily etch silicon. The effective thickness added by the dielectric layer 22 at the opposite end surfaces 11 of the fins 10 results in sections of the trench isolation 18 underneath the dielectric layer 22 being retained at each of the opposite end surfaces 11 of the fins 10 after the trench isolation 18 between sidewalls 13 of the fins 10 is completely removed.

Dielectric spacers 24 are formed at the sidewalls of the fins 10. The dielectric spacers 24 may be formed from a conformal dielectric layer using an anisotropic etching process, such as a reactive ion etching (RIE) process. The conformal dielectric layer may be composed of a dielectric material, such as silicon nitride ($Si_3N_4$), deposited by atomic layer deposition (ALD).

Figure 6:
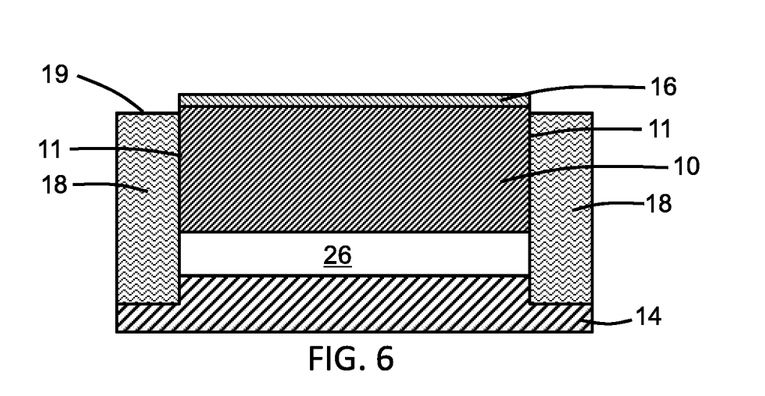
FIG. 6 is a cross-sectional view at a fabrication stage subsequent to FIG. 5.
Figure 6A:
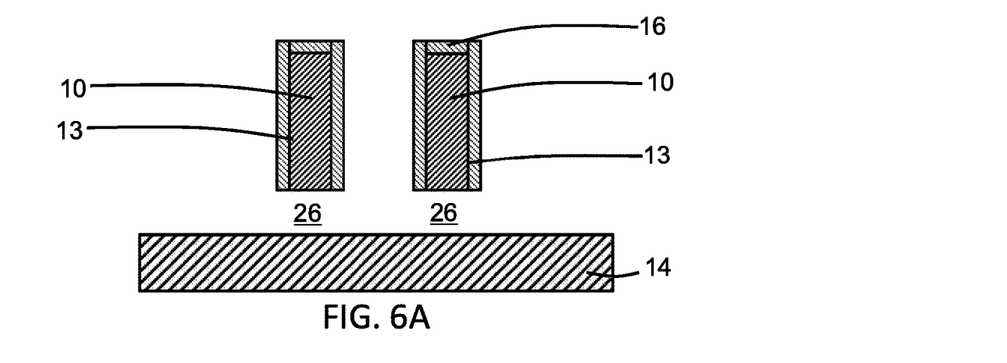
FIG. 6A is a cross-sectional view at a fabrication stage subsequent to FIG. 5A.

With reference to FIGS. 6, 6A in which like reference numerals refer to like features in FIGS. 5, 5A and at a subsequent fabrication stage, the sacrificial layer 12 is completely removed with an etching process that etches the material constituting the sacrificial layer 12 selective to the materials constituting the fins 10, substrate 14, and trench isolation 18. The removal of the sacrificial layer 12 forms a cavity 26 that extends completely beneath the fins 10 and that is arranged vertically between respective bottoms of the fins 10 and a top surface of the substrate 14. The dielectric caps 16 and dielectric spacers 24 enhance the protection provided to the fins 10 during the removal of the sacrificial layer 12. The sections of the trench isolation 18 at each of the opposite end surfaces 11 of the fins 10 provide mechanical support for the fins 10 after the cavity 26 is formed that undercuts the fins 10.

Figure 7:
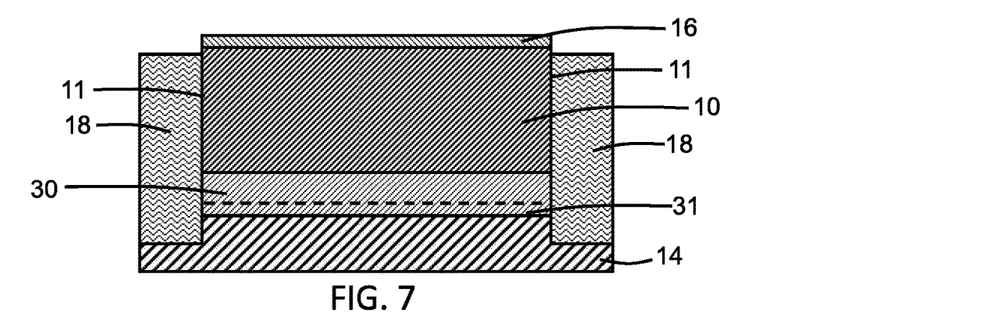
FIG. 7 is a cross-sectional view at a fabrication stage subsequent to FIG. 6.
Figure 7A:
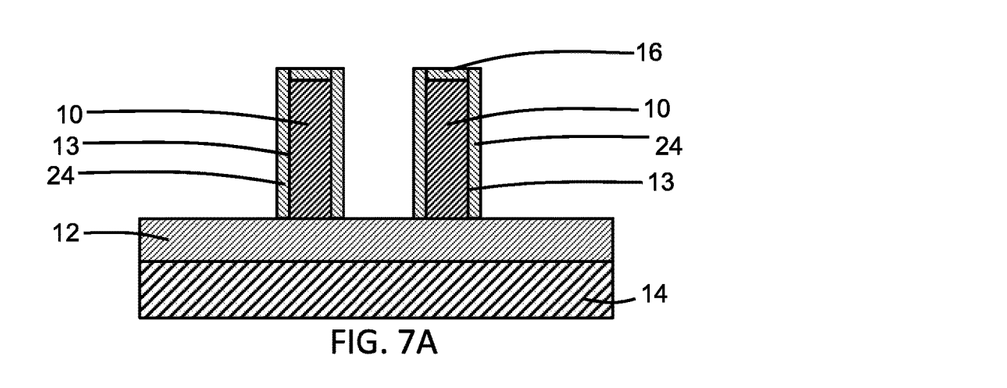
FIG. 7A is a cross-sectional view at a fabrication stage subsequent to FIG. 6A.

With reference to FIGS. 7, 7A in which like reference numerals refer to like features in FIGS. 6, 6A and at a subsequent fabrication stage, a bottom source/drain region 30 composed of a semiconductor material is formed in the cavity 26. The term "source/drain region" as used herein refers to a doped region of semiconductor material that can function as either a source or a drain of a field-effect transistor. The semiconductor material of the bottom source/drain region 30 has a volume equal to the volume of the cavity 26.

The semiconductor material of the bottom source/drain region 30 may be formed using an epitaxial growth process in which the single crystal semiconductor material of the substrate 14 serves as a growth seed for the epitaxial growth process. In an embodiment, the bottom source/drain region 30 may be formed by a selective epitaxial growth (SEG) process in which semiconductor material nucleates for epitaxial growth on semiconductor surfaces (e.g., the substrate 14), but does not nucleate for epitaxial growth from insulator surfaces (e.g., the dielectric caps 16 and dielectric spacers 24). In an embodiment, the bottom source/drain region 30 may be composed of single crystal silicon that has an epitaxial relationship with the substrate 14.

The bottom source/drain region 30 may be in situ doped during the epitaxial growth process to elevate its conductivity after dopant activation. In particular, the semiconductor material of the bottom source/drain region 30 may be heavily doped during epitaxial growth to have either p-type electrical conductivity or n-type electrical conductivity. The fins 10 and the bottom source/drain region 30 may be used to fabricate an n-type vertical-transport field-effect transistor, in which instance the bottom source/drain region 30 may be composed of silicon and may include a concentration of an n-type dopant from Group V of the Periodic Table (e.g., phosphorus (P) and/or arsenic (As)) that imparts n-type electrical conductivity to silicon. Alternatively, the fins 10 and the bottom source/drain region 30 may be used to fabricate a p-type vertical-transport field-effect transistor, in which instance, the bottom source/drain region 30 may be composed of silicon and may include a concentration of p-type dopant from Group III of the Periodic Table (e.g., boron (B), aluminum (Al), gallium (Ga), and/or indium (In)) that imparts p-type electrical conductivity to silicon.

In an embodiment, the semiconductor material of the bottom source/drain region 30 may be deposited as a multilayer structure that further includes a buffer layer 31 as a dopant control buffer that is deposited on the substrate 14 before the heavily-doped section of the bottom source/drain region 30 is deposited on the buffer layer 31. The buffer layer 31, which may be undoped, may operate to alleviate or block dopant diffusion from the main section of the bottom source/drain region 30 to the substrate 14.

Forming the bottom source/drain region 30 with a replacement process that removes the sacrificial layer 12 to form the cavity 26 and replaces the sacrificial layer 12 with the epitaxially-grown semiconductor material of the bottom source/drain region 30 precisely places a uniformly-distributed dopant concentration directly over the portion of the volume of the semiconductor material of the bottom source/drain region 30 that is directly beneath the vertical channel of each of the fins 10. A consequence of the in situ doping during epitaxial growth is that the bottom source/drain region 30 may have a dopant concentration that is distributed uniformly over its entire volume, including the volume directly beneath the fins 10 and their vertical channels. The uniformity in the doping resulting from the replacement process contrasts with conventional processes in which ion implantation and a thermal drive-in are used to introduce dopant beneath the vertical channel of a fin. The dopant distribution produced by the conventional process inherently results in a dopant concentration that is not distributed uniformly over the entire volume of the substrate beneath the vertical channel of a fin.

Figure 8:
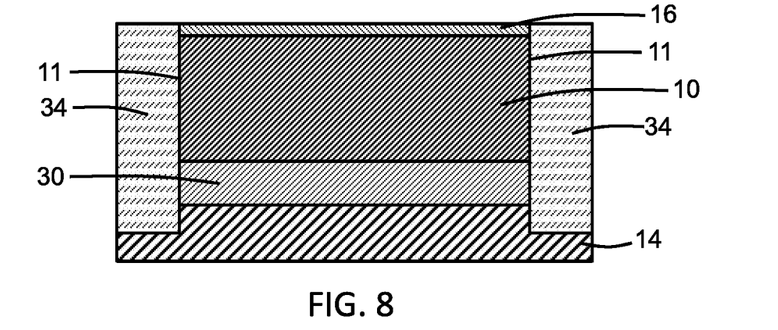
FIG. 8 is a cross-sectional view at a fabrication stage subsequent to FIG. 7.
Figure 8A:
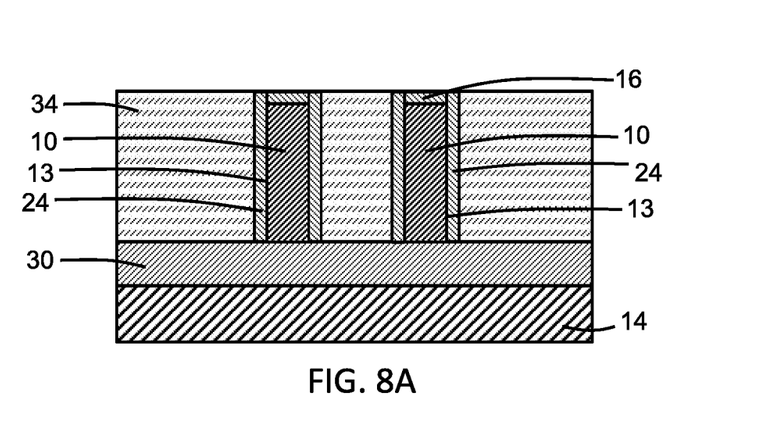
FIG. 8A is a cross-sectional view at a fabrication stage subsequent to FIG. 8.

With reference to FIGS. 8, 8A in which like reference numerals refer to like features in FIGS. 7, 7A and at a subsequent fabrication stage, the trench isolation 18 at the opposite end surfaces 11 of the fins 10 is removed. An interlayer dielectric layer 34 is deposited and planarized using a chemical-mechanical polishing (CMP) process. The interlayer dielectric layer 34 may be composed of a dielectric material, such as silicon dioxide ($SiO_2$), silicon nitride ($Si_3N_4$), fluorine-doped silicon dioxide, or a combination of these and other dielectric materials. Portions of the interlayer dielectric layer 34 fill the trenches at the opposite end surfaces 11 of the fins 10 from which the trench isolation 18 was removed.

Figure 9:
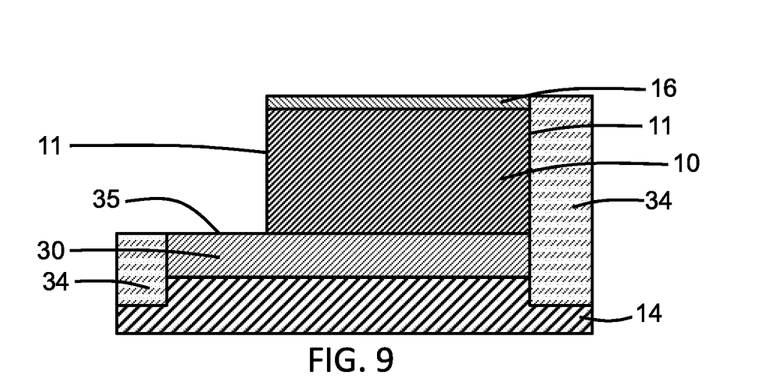
FIGS. 9-13 are cross-sectional views of the device structure at fabrication stages subsequent to FIG. 8.

With reference to FIG. 9 in which like reference numerals refer to like features in FIG. 8 and at a subsequent fabrication stage, the fins 10 may be cut at one end 11 using an etch mask and an etching process to remove a portion of the semiconductor material of the fins 10. An area 35 on the top surface of the bottom source/drain region 30 is exposed by the removal of portions of the fins 10, and portions of the interlayer dielectric layer 34 adjacent to the end surfaces 11 may also be removed. This exposed area 35 may be used to contact the bottom source/drain region 30.

Figure 10:
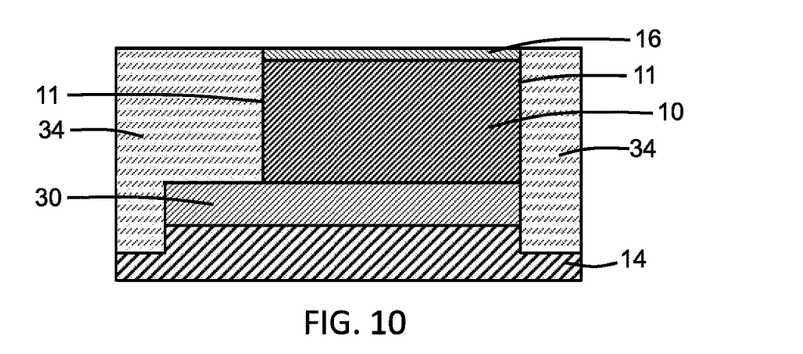

With reference to FIG. 10 in which like reference numerals refer to like features in FIG. 9 and at a subsequent fabrication stage, a dielectric material is deposited to fill the open space created by the fin cut in order to restore the thickness of the interlayer dielectric layer 34 surrounding the fins 10.

Figure 11:
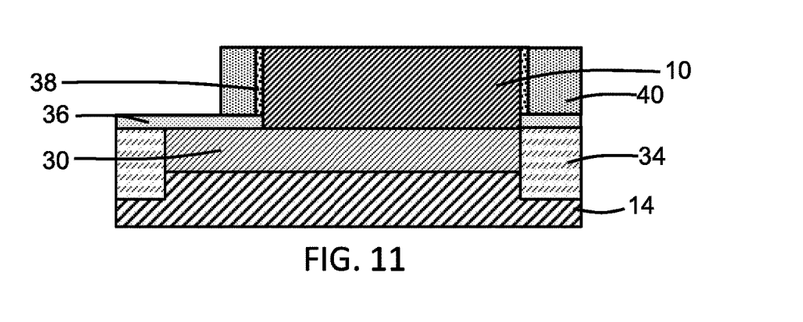

With reference to FIG. 11 in which like reference numerals refer to like features in FIG. 10 and at a subsequent fabrication stage, a bottom spacer layer 36 is formed on the bottom source/drain region 30. The bottom spacer layer 36 may be composed of a low-k dielectric material, such as silicon oxycarbonitride (SiOCN), deposited by ALD. A gate dielectric layer 38 and a gate stack 40 are formed that overlap with a central portion of the fins 10. The gate stack 40 is wrapped about each of the fins 10. The gate dielectric layer 38 may be composed of a dielectric material, such as a high-k dielectric having a dielectric constant (e.g., permittivity) greater than the dielectric constant of silicon dioxide ($SiO_2$). High-k dielectric materials suitable for the gate dielectric layer 38 include, but are not limited to, a hafnium-based dielectric material like hafnium oxide ($HfO_2$), a layered stack of a hafnium-based dielectric material and another dielectric material (e.g., aluminum oxide ($Al_2O_3$)), or combinations of these and other dielectric materials, deposited by ALD. The gate stack 40 may be composed of one or more barrier metal layers and/or work function metal layers, such as titanium aluminum carbide (TiAlC), titanium nitride (TiN), and/or tungsten (W), deposited by physical vapor deposition (PVD) or chemical vapor deposition (CVD).

Figure 12:
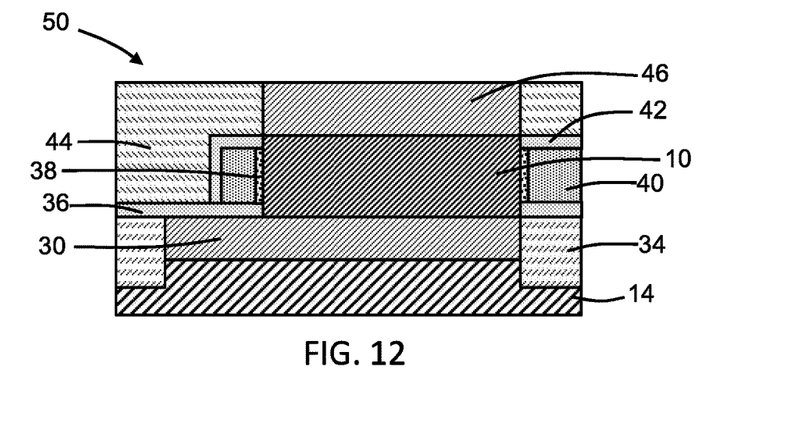

With reference to FIG. 12 in which like reference numerals refer to like features in FIG. 11 and at a subsequent fabrication stage, the gate dielectric layer 38 and gate stack 40 are recessed relative to the fins 10. A spacer layer 42 is formed that coats the gate stack 40. The spacer layer 42 may be composed of a low-k dielectric material, such as silicon oxycarbonitride (SiOCN), deposited by ALD. A dielectric layer 44 is formed that covers the spacer layers 36, 42. The dielectric layer 44 may be composed of a dielectric material, such as silicon dioxide ($SiO_2$), deposited by ALD. The dielectric caps 16 are removed and top source/drain regions 46 are formed in the open spaces vacated by the removed dielectric caps 16. Each top source/drain region 46 is coupled with the top surface of one of the fins 10. The spacer layer 42 is arranged vertically between the top source/drain regions 46 and the gate stack 40 to provide electric isolation.

The top source/drain regions 46 may be an epitaxial layer of semiconductor material formed by an epitaxial growth process with in-situ doping and the single-crystal semiconductor material of the fins 10 operating as a growth seed. The top source/drain regions 46 may be doped to have the same conductivity type as the bottom source/drain region 30. In an embodiment, the top source/drain regions 46 and the bottom source/drain region 30 may be composed of the same semiconductor material (e.g., silicon). If the bottom source/drain region 30 is n-type, then the top source/drain regions 46 may be doped with a concentration of an n-type dopant from Group V of the Periodic Table (e.g., phosphorus (P) and/or arsenic (As)) that imparts n-type electrical conductivity to the constituent semiconductor material. Alternatively, if the bottom source/drain region 30 is p-type, then the top source/drain regions 46 may be doped with a concentration of a p-type dopant from Group III of the Periodic Table (e.g., boron (B), aluminum (Al), gallium (Ga), and/or indium (In)) that imparts p-type electrical conductivity to the constituent semiconductor material.

The resulting device structure is a vertical-transport field-effect transistor 50 that includes the bottom source/drain region 30, the top source/drain regions 46, the fins 10 that are arranged in the vertical direction between the bottom source/drain region 30 and the associated top source/drain region 46, and the gate stack 40. The gate stack 40 is arranged along the height of the fins 10 in the vertical direction between the bottom source/drain region 30 and the top source/drain regions 46. During operation, a vertical channel for vertical carrier transport is defined in a portion of each fin 10 overlapped by the gate stack 40 and carriers are vertically transported in the vertical channel between the bottom source/drain region 30 and the top source/drain regions 46.

Figure 13:
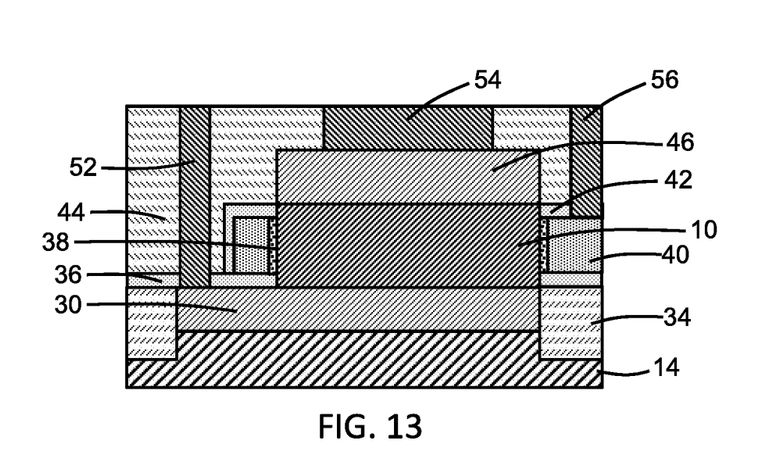

With reference to FIG. 13 in which like reference numerals refer to like features in FIG. 12 and at a subsequent fabrication stage, middle-of-line (MOL) processing and back-end-of-line (BEOL) processing follow, which includes formation of contacts and wiring for a local interconnect structure, and formation of dielectric layers, via plugs, and wiring for a BEOL interconnect structure coupled by the local interconnect structure with the vertical-transport field-effect transistor 50. Contacts 52, 54, 56 may be formed in a thickened dielectric layer 44 as conductive features of a local interconnect structure for the vertical-transport field-effect transistor 50. The contact 52 is aligned with the area 35 on the top surface of the bottom source/drain region 30 that is exposed by the fin cut, the contact 54 is aligned with one of the top source/drain regions 46, and the contact 56 is aligned with the gate stack 40.

Figure 14:
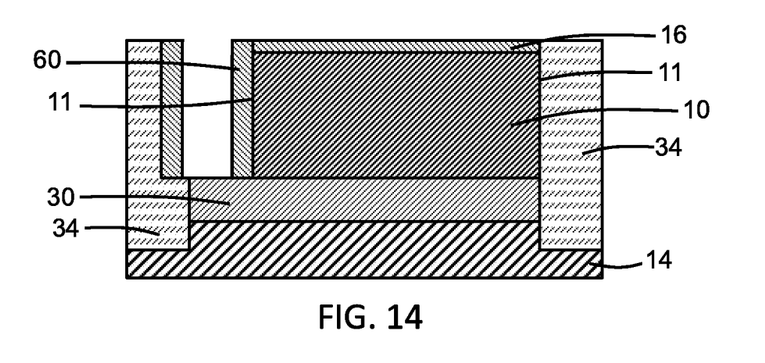
FIG. 14 is a cross-sectional view of a device structure in accordance with an alternative embodiment.

With reference to FIG. 14 in which like reference numerals refer to like features in FIG. 10 and at a subsequent fabrication stage in accordance with alternative embodiments, a dielectric spacer 60 may be formed on the end 11 that is cut by the fin cut. The dielectric spacer 60 may be formed from a conformal dielectric layer (e.g., silicon nitride ($Si_3N_4$)) that is deposited and etched using an anisotropic etching process, such as a RIE process. The process flow proceeds as described in connection with FIGS. 11-13.

Figure 15:
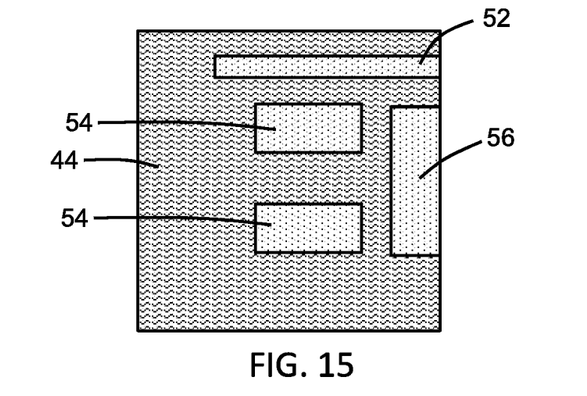
FIG. 15 is a top view of an arrangement of contacts for the device structure of FIG. 12 in accordance with an alternative embodiment.

With reference to FIG. 15 in which like reference numerals refer to like features in FIG. 12 and at a subsequent fabrication stage in accordance with alternative embodiments, the contact 52 to the bottom source/drain region 30 may be relocated to a position adjacent to the fins 10 and may be aligned parallel lengthwise with the fins 10. The exposed area 35 on the top surface of the source/drain region 30 is arranged adjacent to one of the opposite sidewalls 13 of the fins 10. Because of the relocation of the contact 52, the fins 10 do not need to be trimmed by a fin cut to expose an area on the top surface of the bottom source/drain region 30. The contacts 54 and 56 may be formed without modification to their placement as shown in FIGS. 13 and 15.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a structure for a vertical-transport field effect transistor, the method comprising:
   forming a semiconductor fin on a sacrificial layer;
   forming a trench isolation in which the semiconductor fin is embedded;
   removing the trench isolation at opposite sidewalls of the semiconductor fin;
   after removing the trench isolation at the opposite sidewalls of the semiconductor fin, removing the sacrificial layer to form a cavity extending beneath the semiconductor fin while the semiconductor fin is supported by the trench isolation adjacent to opposite end surfaces of the semiconductor fin; and
   forming a semiconductor material in the cavity to provide a source/drain region.

2. The method of claim 1 further comprising:
   before removing the trench isolation at the opposite sidewalls of the semiconductor fin, depositing a dielectric material on the trench isolation adjacent to the opposite end surfaces of the semiconductor fin.

3. The method of claim 2 further comprising:
   forming a mask that exposes the trench isolation adjacent to the opposite end surfaces of the semiconductor fin, wherein the dielectric material is deposited on the trench isolation after forming the mask.

4. The method of claim 3 further comprising:
   after depositing the dielectric material, removing the mask.

5. The method of claim 1 wherein the sacrificial layer is epitaxially grown on a substrate, and forming the source/drain region in the cavity comprises:
   epitaxially growing the semiconductor material inside the cavity using the substrate as a growth seed.

6. The method of claim 5 wherein the semiconductor material includes a dopant control buffer on the substrate and a main section between the dopant control buffer and the semiconductor fin, and the main section is doped during epitaxial growth with an n-type dopant or a p-type dopant.

7. The method of claim 5 wherein the semiconductor material is doped during epitaxial growth with an n-type dopant or a p-type dopant.

8. The method of claim 1 further comprising:
   after forming the source/drain region in the cavity, removing a section of the semiconductor fin to expose an area on a top surface of the source/drain region.

9. The method of claim 8 further comprising:
forming a contact extending vertically to the exposed area on the source/drain region.

10. The method of claim 8 further comprising:
forming a dielectric layer on the exposed area on the source/drain region;
forming an opening in the dielectric layer extending vertically to the exposed area on the source/drain region;
forming a dielectric spacer on one of the opposite end surfaces of the semiconductor fin that is adjacent to the exposed area on the source/drain region; and
forming a contact in the opening.

11. The method of claim 8 wherein the exposed area on the source/drain region is arranged adjacent to one of the opposite sidewalls of the semiconductor fin.

12. The method of claim 8 wherein the exposed area on the source/drain region is arranged adjacent to one of the opposite end surfaces of the semiconductor fin.

13. The method of claim 1 wherein the sacrificial layer is completely removed to form the cavity.

14. The method of claim 1 wherein the sacrificial layer is epitaxially grown on a substrate, the sacrificial layer is composed of a silicon-germanium alloy, and the substrate and the semiconductor fin are composed of silicon.

15. The method of claim 1 wherein the sacrificial layer is epitaxially grown on a substrate, and the sacrificial layer is removed by an etching process that is selective to the substrate and the semiconductor fin.

16. The method of claim 1 wherein the sacrificial layer is epitaxially grown on a substrate, and the trench isolation extends vertically to penetrate through the sacrificial layer and into the substrate.

17. The method of claim 1 wherein the trench isolation extends vertically to penetrate through the sacrificial layer.

* * * * *